United States Patent
Yang et al.

(10) Patent No.: US 11,177,802 B2
(45) Date of Patent: Nov. 16, 2021

(54) AMPLITUDE-PHASE CANCELING CIRCUIT FOR SWITCH LINEARITY

(71) Applicant: SKYWORKS SOLUTIONS, INC., Woburn, MA (US)

(72) Inventors: Zijiang Yang, Lexington, MA (US); Nuttapong Srirattana, Billerica, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/706,368

(22) Filed: Dec. 6, 2019

(65) Prior Publication Data

US 2020/0235730 A1 Jul. 23, 2020

Related U.S. Application Data

(60) Provisional application No. 62/777,064, filed on Dec. 7, 2018.

(51) Int. Cl.
*H03K 17/16* (2006.01)
*H01L 27/12* (2006.01)
*H04B 1/40* (2015.01)

(52) U.S. Cl.
CPC ....... *H03K 17/162* (2013.01); *H01L 27/1203* (2013.01); *H04B 1/40* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,236,272 B1 * | 5/2001 | Takei | ............... | H01P 5/16 330/124 R |
| 6,778,023 B2 * | 8/2004 | Christensen | ............. | H03H 7/12 331/16 |
| 7,098,751 B1 * | 8/2006 | Wong | ............. | H03B 5/1231 331/117 R |
| 9,461,609 B2 * | 10/2016 | Madan | ............... | H03H 1/02 |
| 10,050,609 B2 * | 8/2018 | Yoo | ............... | H03H 11/04 |
| 10,187,108 B2 * | 1/2019 | Lin | ............... | H04B 1/44 |
| 10,263,616 B1 * | 4/2019 | Scott | ............... | H03K 17/693 |
| 10,469,121 B2 * | 11/2019 | Hurwitz | ............... | H04B 1/0475 |
| 10,659,031 B2 * | 5/2020 | Franck | ............... | H03K 17/102 |
| 10,715,133 B1 * | 7/2020 | Scott | ............... | H03K 17/567 |
| 2011/0316062 A1 * | 12/2011 | Kondo | ............... | H04B 1/48 257/312 |
| 2014/0266415 A1 * | 9/2014 | Kerr | ............... | H03H 11/1213 327/552 |

(Continued)

*Primary Examiner* — Adam D Houston
(74) *Attorney, Agent, or Firm* — Chang & Hale LLP

(57) ABSTRACT

Amplitude-phase canceling circuit for switch linearity. In some embodiments, a radio-frequency switch circuit can include first and second switch arms, with each switch arm including a plurality of transistors arranged in series to form a stack between a first node and a second node. The first node of the first switch arm can be coupled to the first node of the second switch arm. The radio-frequency switch circuit can further include an amplitude-phase cancelling block implemented across one or more transistors of each switch arm, and configured such that a third harmonic resulting from an ON state of the first switch arm is substantially canceled by a third harmonic resulting from an OFF state of the second switch arm.

14 Claims, 10 Drawing Sheets

(56) References Cited

U.S. PATENT DOCUMENTS

| | | | |
|---|---|---|---|
| 2015/0285998 A1* | 10/2015 | Babakhani | G02B 6/13 438/27 |
| 2017/0070258 A1* | 3/2017 | Shih | H04L 27/2007 |
| 2018/0091131 A1* | 3/2018 | Wang | H01L 23/66 |
| 2018/0138927 A1* | 5/2018 | Nagumo | H04L 5/001 |
| 2018/0367177 A1* | 12/2018 | Ramasamy | H04B 1/406 |
| 2019/0089398 A1* | 3/2019 | Hurwitz | H04B 1/0475 |
| 2019/0245086 A1* | 8/2019 | Heiman | H01L 29/7845 |
| 2020/0195244 A1* | 6/2020 | Wang | H01L 23/66 |
| 2020/0235730 A1* | 7/2020 | Yang | H01L 27/1203 |

\* cited by examiner

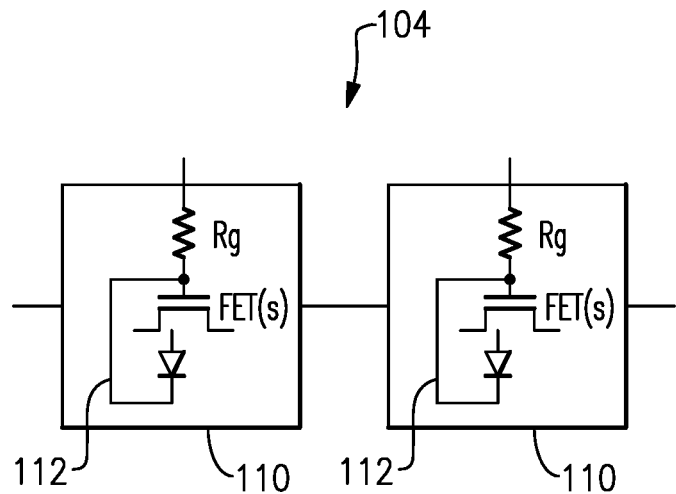
FIG.3
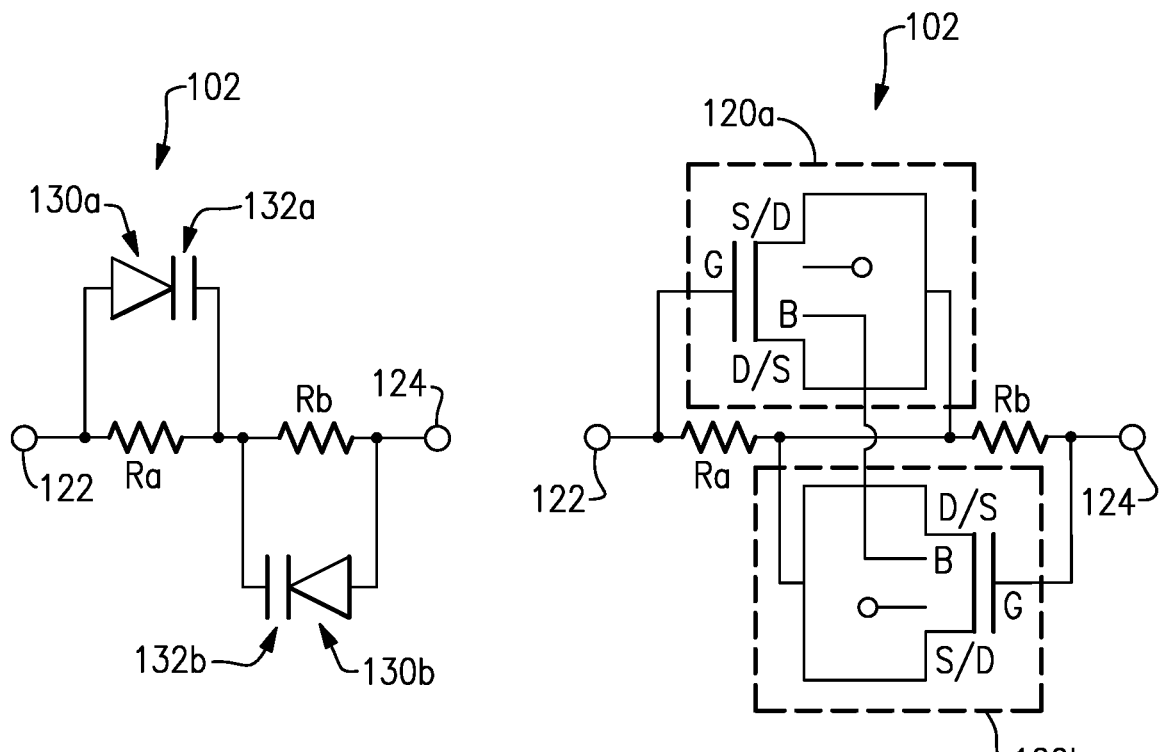
FIG.4
FIG.5

AMPLITUDE-PHASE CANCELING CIRCUIT FOR SWITCH LINEARITY

CROSS-REFERENCE TO RELATED APPLICATION(S)

This application claims priority to U.S. Provisional Application No. 62/777,064 filed Dec. 7, 2018, entitled AMPLITUDE-PHASE CANCELING CIRCUIT FOR SWITCH LINEARITY, the disclosure of which is hereby expressly incorporated by reference herein in its respective entirety.

BACKGROUND

Field

The present disclosure relates to radio-frequency (RF) switches.

Description of the Related Art

In radio-frequency (RF) applications, switches can be implemented with semiconductor devices such as field-effect transistors (FETs). Such switches can allow, for example, routing of RF signals in wireless devices.

SUMMARY

In some implementations, the present disclosure relates to a radio-frequency switch circuit that includes first and second switch arms, with each switch arm including a plurality of transistors arranged in series to form a stack between a first node and a second node. The first node of the first switch arm is coupled to the first node of the second switch arm. The radio-frequency switch circuit further includes an amplitude-phase cancelling block implemented across one or more transistors of each switch arm, and configured such that a third harmonic resulting from an ON state of the first switch arm is substantially canceled by a third harmonic resulting from an OFF state of the second switch arm.

In some embodiments, the amplitude-phase cancelling block can include a first combination arranged in series with a second combination, with each of the first and second combinations including a series combination of a diode and a capacitance in a parallel arrangement with a resistance. The diode of the first combination can be implemented in an anti-parallel manner relative to the diode of the second combination. The diodes of the first and second combinations can be configured to generate harmonics by voltage distributed by a voltage divider formed by the resistances of the first and second combinations. The capacitances of the first and second combinations can be configured to provide respective phase shifts of the harmonics.

In some embodiments, the anti-parallel configuration of the diodes of the first and second combinations can result in the amplitude-phase cancelling block generating substantially nil amount of a second harmonic. In some embodiments, the amplitude-phase cancelling blocks associated with the first and second switch arms can be selected so that a third harmonic associated with the first switch arm is substantially canceled by a third harmonic associated with the second switch arm.

In some embodiments, each diode of the amplitude-phase cancelling block can be implemented as a field-effect transistor configured as a diode, where source and drain of the field-effect transistor are coupled. In some embodiments, bodies of the field-effect transistors can be coupled. In some embodiments, a gate-drain capacitance or a gate-source capacitance of each field-effect transistor can be configured to provide the respective phase shifts of the harmonics.

In some embodiments, the amplitude-phase cancelling block can be implemented with the respective switch arm in a symmetric manner. In some embodiments, the number of transistors between the phase cancelling block and the first node can be the same as the number of transistors between the phase cancelling block and the second node. In some embodiments, each switch arm can be configured to be operated with the first node as an input node, or with the second node as an input node.

In some embodiments, the amplitude-phase cancelling block can be implemented with the respective switch arm in an asymmetric manner. In some embodiments, each switch arm can be configured to be operated with one of the first and second nodes as an input node, and the other node as an output node.

In some embodiments, at least the plurality of transistors can be implemented as field-effect transistors. In some embodiments, the field-effect transistors can be implemented as silicon-on-insulator devices. In some embodiments, at least some of the amplitude-phase cancelling blocks can be implemented as field-effect transistor like devices.

In accordance with a number of implementations, the present disclosure relates to a semiconductor die that includes a substrate and a radio-frequency switch circuit implemented on the substrate. The radio-frequency switch circuit includes first and second switch arms, with each switch arm including a plurality of transistors arranged in series to form a stack between a first node and a second node. The first node of the first switch arm is coupled to the first node of the second switch arm. The radio-frequency switch circuit further includes an amplitude-phase cancelling block implemented across one or more transistors of each switch arm, and configured such that a third harmonic resulting from an ON state of the first switch arm is substantially canceled by a third harmonic resulting from an OFF state of the second switch arm.

In some embodiments, the substrate can include a silicon-on-insulator substrate.

In some teachings, the present disclosure relates to a radio-frequency module that includes a packaging substrate configured to support a plurality of components, and a radio-frequency switch circuit implemented on the packaging substrate. The radio-frequency switch circuit includes first and second switch arms, with each switch arm including a plurality of transistors arranged in series to form a stack between a first node and a second node. The first node of the first switch arm is coupled to the first node of the second switch arm. The radio-frequency switch circuit further includes an amplitude-phase cancelling block implemented across one or more transistors of each switch arm, and configured such that a third harmonic resulting from an ON state of the first switch arm is substantially canceled by a third harmonic resulting from an OFF state of the second switch arm.

In some embodiments, at least the first and second switch arms can be implemented on a semiconductor die. In some embodiments, substantially all of the radio-frequency switch circuit can be implemented on the semiconductor die. In some embodiments, the radio-frequency module can be a switch module.

According to a number of implementations, the present disclosure relates to a wireless device that includes a transceiver and a front-end module configured to support routing of one or more signals associated with the transceiver. The front-end module includes a radio-frequency switch circuit having first and second switch arms, with each switch arm including a plurality of transistors arranged in series to form a stack between a first node and a second node. The first node of the first switch arm is coupled to the first node of the second switch arm. The radio-frequency switch circuit further includes an amplitude-phase cancelling block implemented across one or more transistors of each switch arm, and configured such that a third harmonic resulting from an ON state of the first switch arm is substantially canceled by a third harmonic resulting from an OFF state of the second switch arm. The wireless device further includes an antenna in communication with the front-end module and configured to support operation of the wireless device with the one or more signals.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 3 shows an example of a switch arm having a plurality of transistor blocks arranged in series.

FIG. 4 shows that in some embodiments, an amplitude-phase cancelling block (APCB) having one or more features as described herein can include a first combination of a diode, a capacitance, and a resistance, and a second combination of a diode, a capacitance, and a resistance.

FIG. 5 shows an example of an APCB that can be implemented to provide the functionalities associated with the APCB of FIG. 4.

DETAILED DESCRIPTION OF SOME EMBODIMENTS

The headings provided herein, if any, are for convenience only and do not necessarily affect the scope or meaning of the claimed invention.

Switches are important components in wireless mobile devices. Switches such as SOI MOSFET (silicon-on-insulator metal-oxide-semiconductor field-effect transistor) switches are commonly utilized for low-loss high frequency switching applications. Since these switches are made as semiconductor devices, they can generate harmonics naturally when radio-frequency (RF) power goes through the switches. Beside low insertion loss and high isolation, performance parameters such as 3rd harmonics and IP3 are important factors for wireless applications such as LTE applications. By way of an example, a requirement of 3fo harmonics at a cellular band B17 can be specified to be below −105 dB. Such a performance requirement is difficult to meet for a switch without a filter.

There are several ways to reduce harmonics associated with switches. For example, an increase in the size of FETs in a switch can improve the power handling capability, so that same input power will generate less harmonics from big FETs, when compared to smaller FETs devices. However, such an increase in size of the FETs can slow down switching speed of a switch. Moreover, size of switches is under design pressure to be packaged smaller due to limited spaces in mobile devices.

In another example, a filter can be added between a switch and an antenna. However, adding a filter also adds loss to a signal. It is also noted that it is typically not practical to utilize a diplexer to reject IP3 between a switch and an antenna.

Figure 1:
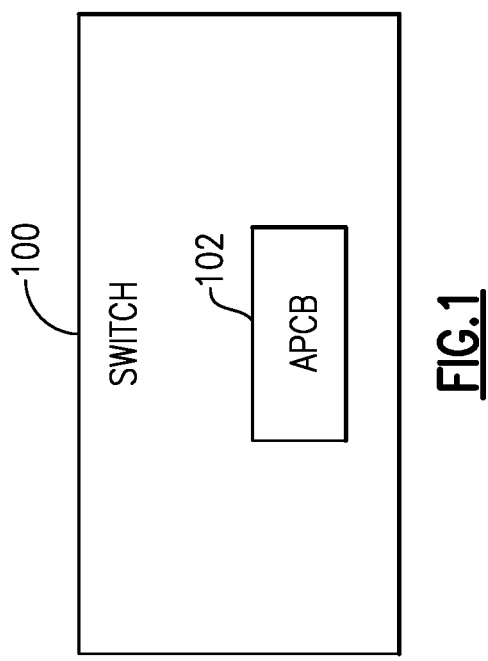
FIG. 1 depicts a switch circuit or device having an amplitude-phase cancelling block (APCB).

FIG. 1 depicts a switch circuit or device 100 (also referred to as a switch) having an amplitude-phase cancelling block (APCB) 102. For the purpose of description, a block can be a circuit having one or more elements. Examples of such an APCB are described herein in greater detail.

Figure 2:
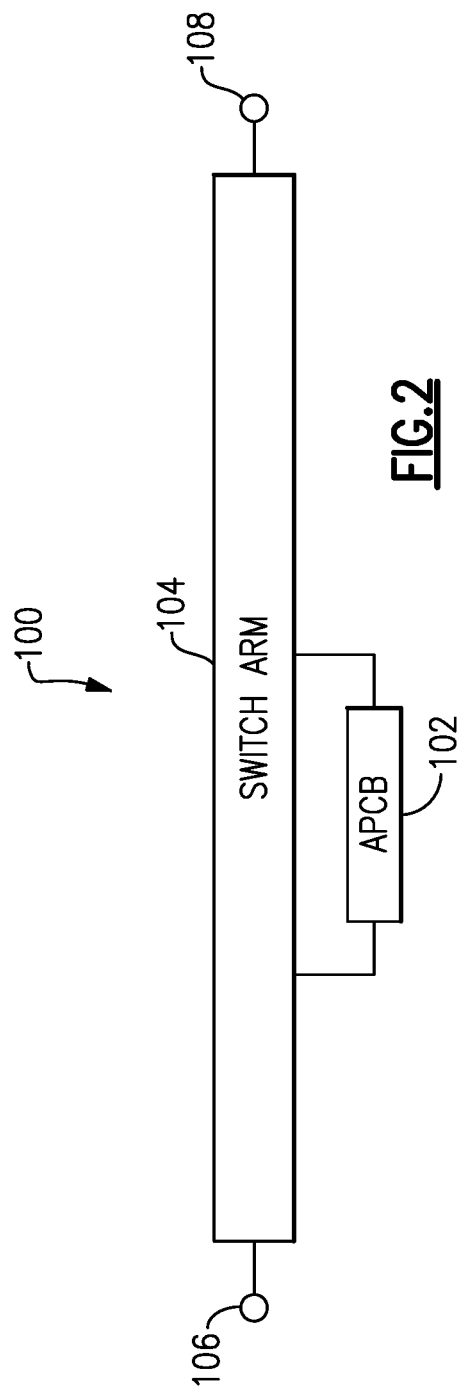
FIG. 2 shows that in some embodiments, the switch of FIG. 1 can include a switch arm having a plurality of switching transistors arranged in series.

FIG. 2 shows that in some embodiments, the switch 100 of FIG. 1 can include a switch arm 104 having a plurality of switching transistors (e.g., FETs) arranged in series. An APCB 102 having one or more features as described herein can be coupled to such a switch arm to provide a desired functionality.

In the example of FIG. 2, the switch 100 is shown to include first and second nodes 106, 108. In some embodiments, the first node 106 can be an input node for a signal, and the second node 108 can be an output node for the signal. It will be understood that the switch 100 may or may not operate in reverse.

FIG. 3 shows an example of a switch arm 104 having a plurality of transistor blocks 110 arranged in series. For the purpose of description, it will be understood that each transistor block 110 can include one or more FETs. For example, if a plurality of FETs are in a transistor block 110, such FETs can be arranged in parallel. It will also be understood that a given switch arm can include more or less number of transistor blocks than the two example blocks depicted in FIG. 3.

Referring to FIG. 3, each transistor block 110 can be turned ON or OFF by controlling a voltage applied to gate(s) of the FET(s). In some embodiments, all of the transistor blocks 110 in the switch arm 104 can be turned ON or OFF together to result in the switch arm itself being ON or OFF.

In the example of FIG. 3, each FET is depicted as having its body coupled (112) to the gate through a diode. It will be understood that a switch having one or more features as described herein can have its FETs configured in other manners, including a configuration without the body-gate coupling, a configuration in which other portions of the FET are coupled, etc.

It is noted that in a switch arm such as the example switch arm 104 of FIG. 3, 3rd harmonics can be generated by series FETs in the ON state. In such a state, voltage drop on series FETs are low because of low on-resistance (Ron) of the FETs.

It is further noted that the 3rd harmonics typically result from 3rd order component of an RF current flowing through the FETs. Because the FETs in the OFF state stops RF voltage, one can couple an amplitude-phase cancelling block (APCB) that includes anti-parallel diodes and resistors, with the FETs. In such a configuration, the diodes, resistors, and the coupling location of the APCB can be selected such that the 3rd order harmonics are canceled or reduced.

FIG. 4 shows that in some embodiments, an amplitude-phase cancelling block (APCB) 102 having one or more features as described herein can include a first combination of a diode 130a, a capacitance 132a, and a resistance Ra, and a second combination of a diode 130b, a capacitance 132b, and a resistance Rb. Such an arrangement of the first and second combinations can be implemented between first and second nodes 122, 124.

In such an arrangement, the diodes 130a, 130b can generate harmonics by voltage distributed by a respective voltage divider formed by the corresponding resistances Ra, Rb. The capacitances 132a, 132b can shift phases of such harmonics. Thus, the first and second combinations, arranged so that the diodes 130a, 130b are in an anti-parallel configuration, do not generate, or generate a reduced amount of, an overall second harmonics. Each of the first and second combinations can generate harmonics amplitude and phase by adjustment of the respective combination's resistance.

FIG. 5 shows an example of an APCB 102 that can be implemented to provide the functionalities associated with the APCB 102 of FIG. 4. In the example of FIG. 5, a field-effect transistor (FET) device can be configured as a diode. Thus, a first FET device 120a can function as the diode 130a, and a second FET device 120b can function as the diode 130b of FIG. 4.

More particularly, in each of the first and second FET devices 120a, 120b, the source and drain of the transistor can be coupled. Further, the body of the transistor of the first FET device 120a can be coupled to the body of the transistor of the second FET device 120b.

In some embodiments, each of the first and second FET devices 120a, 120b can be configured so that its gate-drain capacitance (Cgd) and/or gate-source capacitance (Cgs) provide an appropriate harmonic phase shift (e.g., similar to phase shifting provided by the capacitance 132a or 132b in FIG. 4). It will be understood that the harmonic phase shifting capacitance of the first FET device 120a may or may not be the same as the harmonic phase shifting capacitance of the second FET device 120b.

In the example of FIG. 4, at least some of the harmonics amplitude and phase of each of the first and second combinations can be adjusted by the respective resistance. In the example of FIG. 5, such harmonics amplitude and phase of each FET device (120a or 120b) can be adjusted by the respective resistance (Ra or Rb), the corresponding transistor's periphery configuration, and/or the gate length of the transistor.

Figure 6:
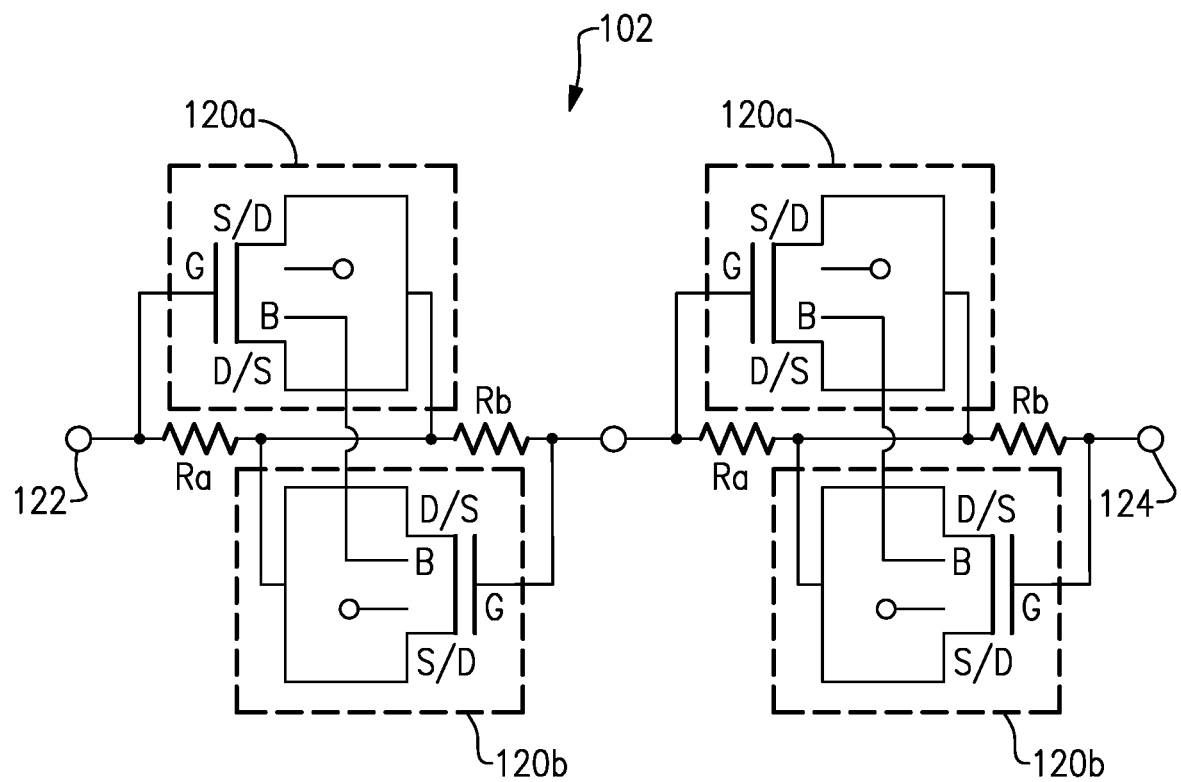
FIG. 6 shows that in some embodiments, an APCB having one or more features as described herein can include a plurality of blocks arranged in a stack configuration between first and second nodes.

FIG. 6 shows that in some embodiments, an APCB 102 having one or more features as described herein can include a plurality of blocks arranged in a stack configuration between first and second nodes 122, 124. In the example of FIG. 6, two blocks are arranged in series between the first and second nodes 122, 124, with each block being similar to the block 102 of FIG. 5.

Figure 7:
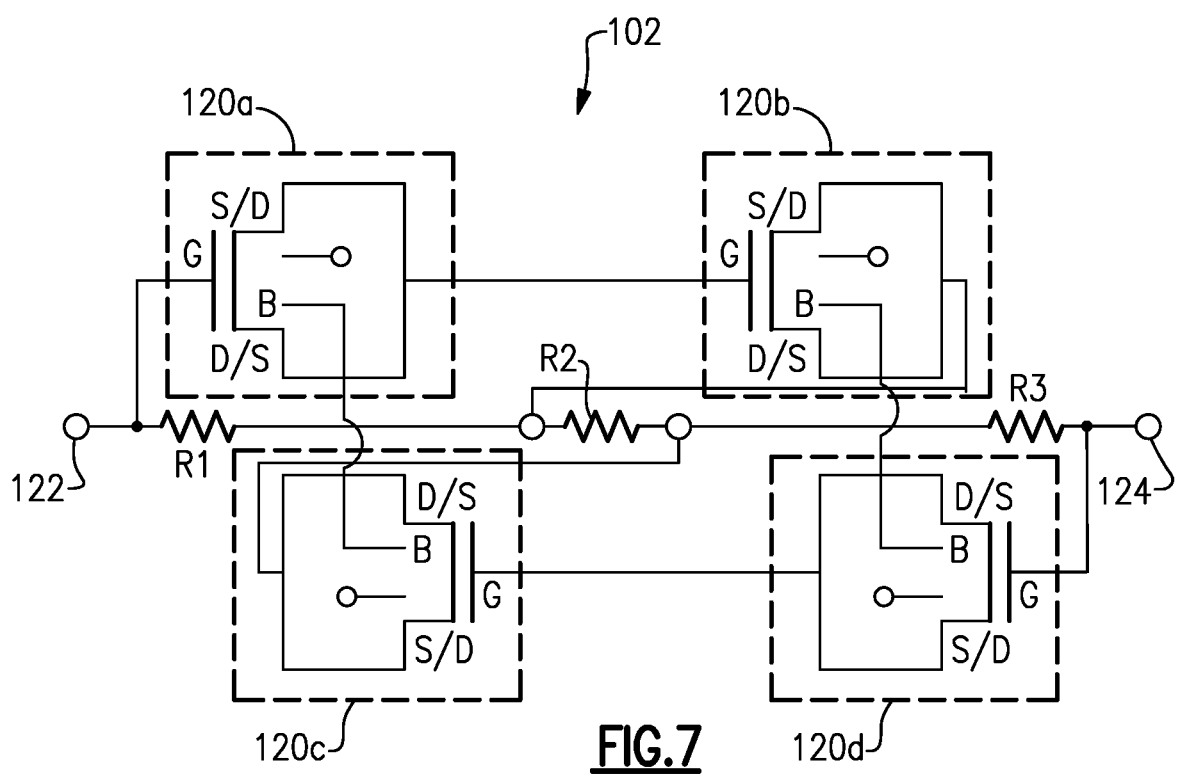
FIG. 7 shows that in some embodiments, an APCB having one or more features as described herein can be implemented in a voltage divider configuration between first and second nodes.

FIG. 7 shows that in some embodiments, an APCB 102 having one or more features as described herein can be implemented in a voltage divider configuration between first and second nodes 122, 124. In the example of FIG. 7, three resistors R1, R2, R3 are shown to be arranged in series between the first and second nodes 122, 124. A first FET device 120a, a second FET device 120b, a third FET device 120c, and a fourth FET device 120d, with each being configured as described herein in reference to FIGS. 4 and 5, can be arranged relative to the three resistors R1, R2, R3 so as to provide the voltage divider configuration.

For example, the gate of the transistor of the first FET device 120a can be coupled to the first node 122, and the connected-source/drain of the transistor of first FET device 120a can be coupled to the gate of the transistor of the second FET device 120b. The connected-source/drain of the transistor of the second FET device 120b can be coupled to a node between the first resistor R1 and the second resistor R2.

Similarly, the third and fourth FET devices 120c, 120d can be arranged so as to provide an anti-parallel configuration with respect to the first and second FET devices 120a, 120b. More particularly, the gate of the transistor of the fourth FET device 120d can be coupled to the second node 124, and the connected-source/drain of the transistor of the fourth FET device 120d can be coupled to the gate of the transistor of the third FET device 120c. The connected-source/drain of the transistor of the third FET device 120c can be coupled to a node between the third resistor R3 and the second resistor R2.

In the example of FIG. 7, the body of the transistor of the first FET device 120a can be coupled to the body of the transistor of the third FET device 120c. Similarly, the body of the transistor of the second FET device 120b can be coupled to the body of the transistor of the fourth FET device 120d.

Figure 8:
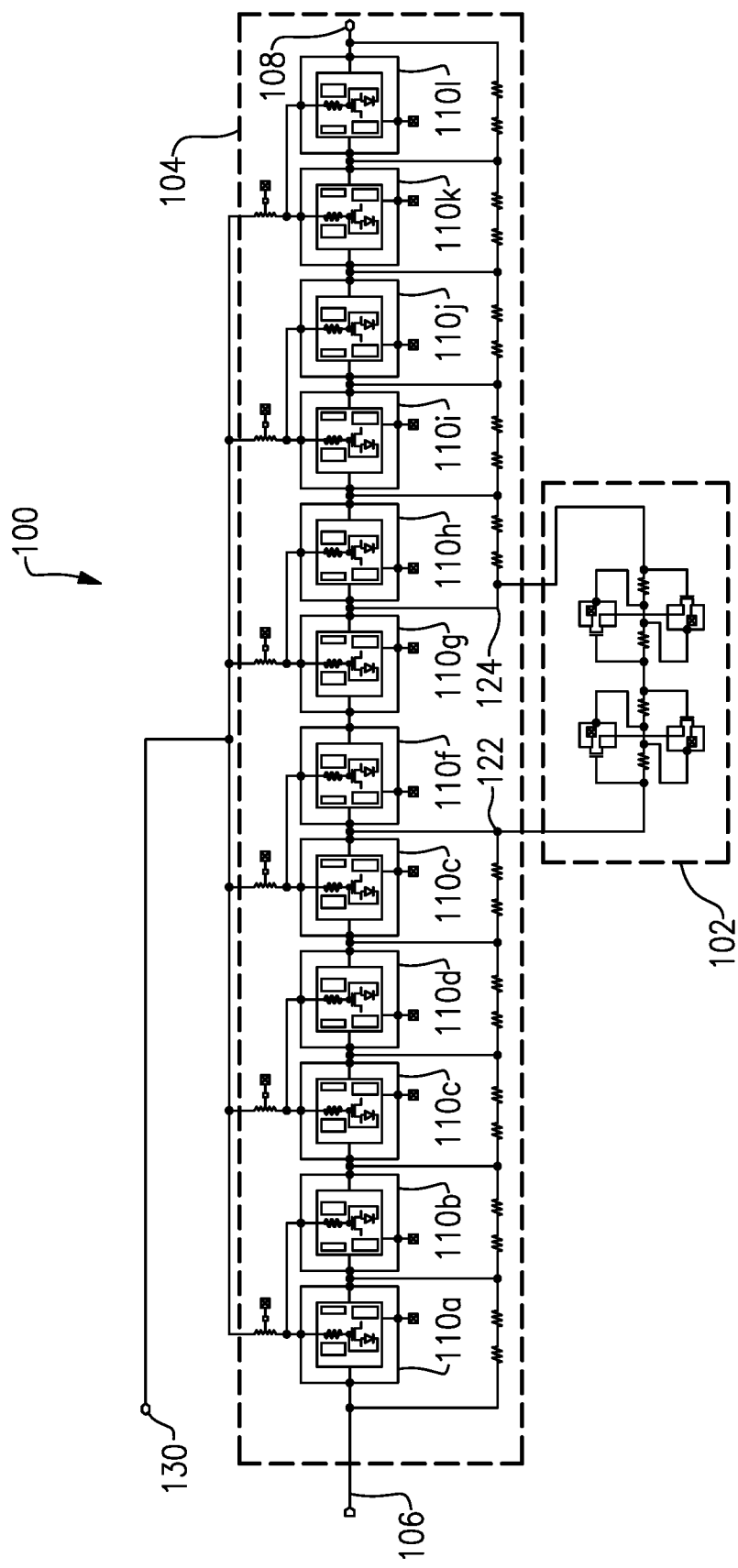
FIG. 8 shows an example of a switch circuit having a stack of transistor blocks arranged in series between first and second nodes so as to form a switch arm.

FIG. 8 shows an example of a switch circuit 100 having a stack of transistor blocks (110a to 110l) arranged in series between first and second nodes 106, 108 so as to form a switch arm 104. In some embodiments, each transistor block can be similar to the transistor block 110 described herein in reference to FIG. 3. In the example of FIG. 8, there are twelve of such transistor blocks in the switch arm 104;

however, it will be understood that the switch arm 104 can have different numbers of transistor blocks.

In the example of FIG. 8, the switch circuit 100 can further include an APCB 102 implemented for at least some of the transistor blocks of the switch arm 104. For example, the APCB 102 of FIG. 8 is shown to include a stack of two blocks, similar to the example of FIG. 6. Such an APCB can be arranged between nodes 122, 124 that are on left and right sides of the two middle transistor blocks 110f, 110g, respectively. Thus, the APCB 102 with the two blocks are arranged to be parallel with the two middle transistor blocks 110f, 110g.

In the example of FIG. 8, each of the five transistor blocks (110a to 110e) on the left side of the two middle transistor blocks 110f, 110g (i.e., five transistor blocks between the nodes 106 and 122) is shown to have a resistive coupling between its source and drain nodes. Similarly, each of the five transistor blocks (110h to 110l) on the right side of the two middle transistor blocks 110f, 110g (i.e., five transistor blocks between the nodes 124 and 108) is shown to have a resistive coupling between its source and drain nodes.

In the example of FIG. 8, the gates of the twelve transistor blocks (110a to 110l) of the switch arm 104 are shown to be provided with a gate voltage in a distributed manner from a voltage node 130.

The switch circuit 100 in FIG. 8 is an example of a symmetric configuration where an APCB 102 is implemented at or near the middle of a stack of transistor blocks. In such a symmetric configuration, the number of transistor block(s) on one side of the APCB 102 can be the same or approximately the same as the number of transistor block(s) on other side of the APCB 102.

In some embodiments, such a symmetric configuration of the switch circuit 100 can be desirable where the switch circuit 100 is utilized in both directions. For example, and referring to FIG. 8, the switch circuit 100 can be utilized so that an RF signal is input into the node 106 and output through the node 108, or in reverse so that an RF signal is input into the node 108 and output through the node 106.

In some embodiments, the switch circuit 100 (having one switch arm 104) of FIG. 8 can be implemented as a single-pole-single-throw (SPST) switch. Such an SPST switch can benefit from one or more features of the APCB 102 as described herein.

Figure 9:
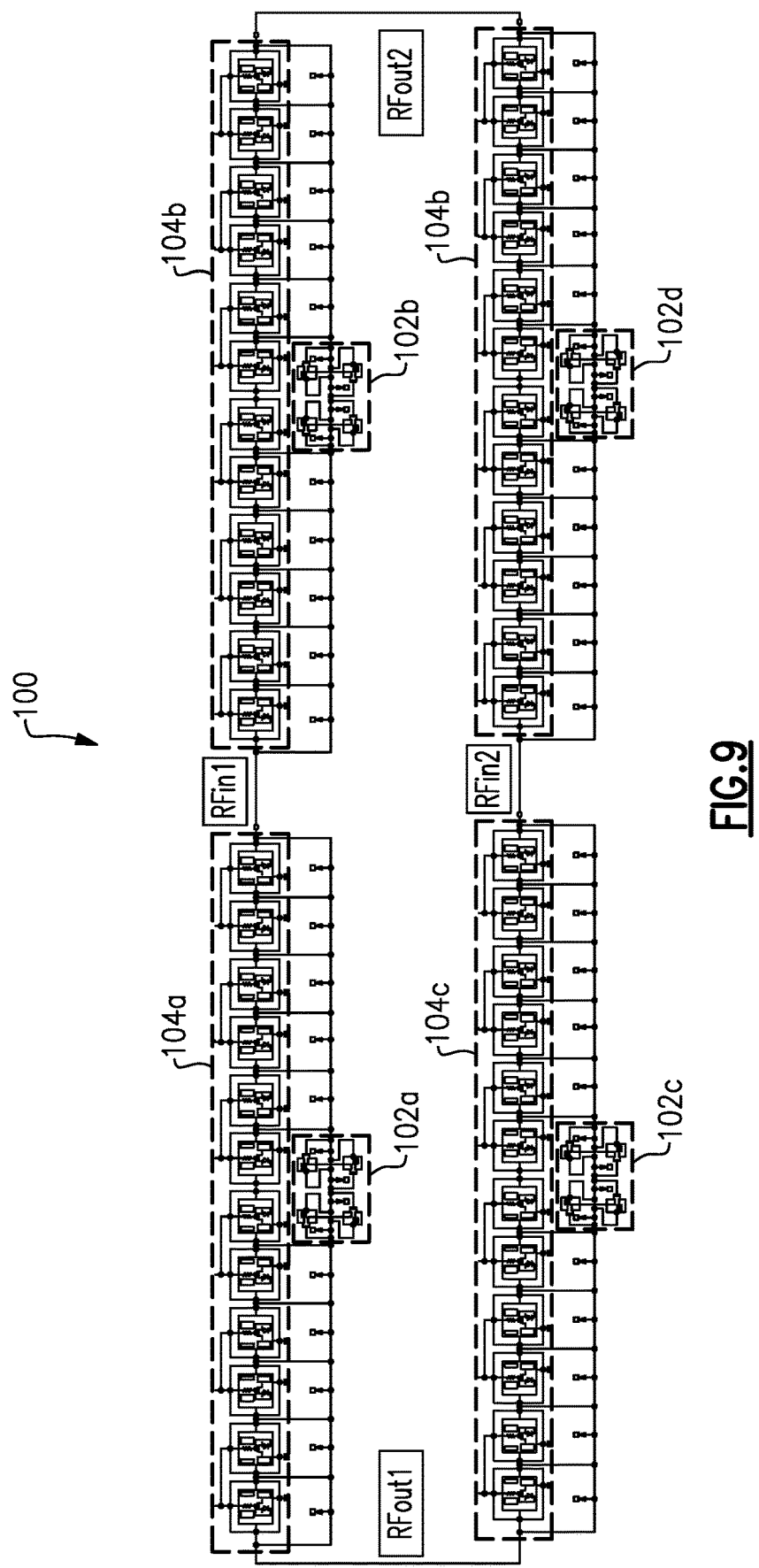
FIG. 9 shows a switch circuit implemented as a double-pole-double-throw (DPDT) switch having two inputs and two outputs.

In some embodiments, one or more features of the present disclosure can also be implemented in other types of switches. In general, an M-pole-N-throw (MPNT, where each of M and N is a positive integer) switch can include one or more amplitude-phase cancelling blocks (APCBs) for one or more switch arms. As a more specific example, FIG. 9 shows a switch circuit 100 implemented as a double-pole-double-throw (DPDT) switch having two inputs RFin1, RFin2 and two outputs RFout1, RFout2. The first input RFin1 is coupled to the first output RFout1 through a switch arm 104a, and also coupled to the second output RFout2 through a switch arm 104b. The second input RFin2 is coupled to the first output RFout1 through a switch arm 104c, and also coupled to the second output RFout2 through a switch arm 104d.

In the example of FIG. 9, an APCB (102a, 102b, 102c or 102d) is shown to be implemented for each switch arm (104a, 104b, 104c or 104d, respectively). Such an APCB is shown to be implemented to provide a symmetric functionality for the respective switch arm, similar to the example of FIG. 8, thereby supporting a reverse operation (e.g., where the inputs/outputs operate as outputs/inputs) with similar performance levels.

Figure 10:
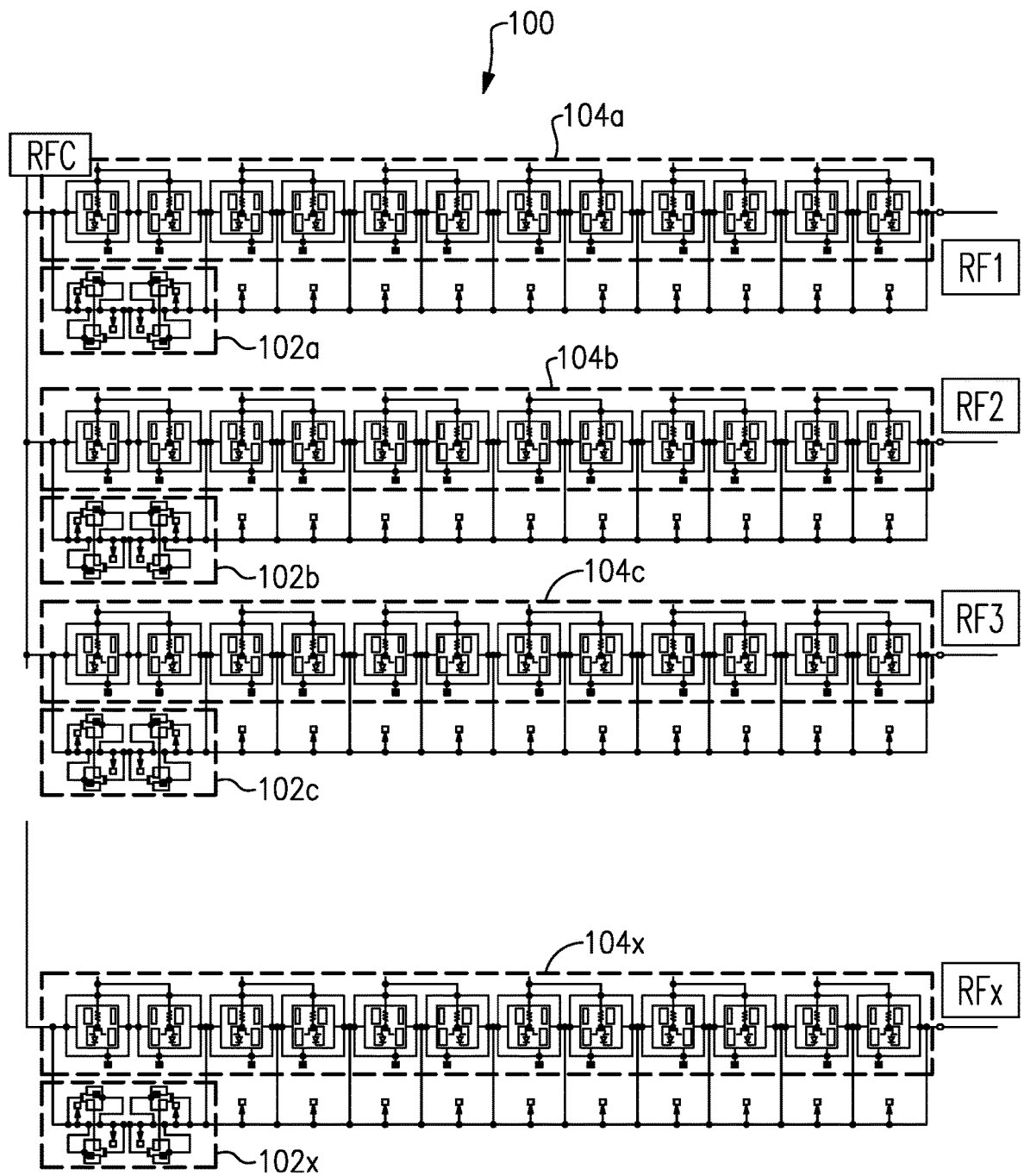
FIG. 10 shows that in some embodiments, a switch circuit can include one or more switch arms, with each switch arm having an APCB implemented in an asymmetric manner.

FIG. 10 shows that in some embodiments, a switch circuit 100 can include one or more switch arms, with each switch arm having an APCB implemented in an asymmetric manner. Such a configuration can be desirable when the switch circuit 100 is utilized in a manner where an input signal flows in one direction.

For example, suppose the switch circuit 100 of FIG. 10 includes X switch arms 104a, 104b, 104c, . . . , 104x, with one sides of the switch arms being coupled to a common node RFC (e.g., on the left side of each switch arm in FIG. 10) and the other side of each arm being coupled to a separate node (e.g., RF1, RF2, RF3, . . . , RFx on the right side of each switch arm in FIG. 10). Such a switch circuit can be utilized as a single-pole-X-throw (SPXT) switch, with the common node RFC being the pole and the separate nodes RF1, RF2, RF3, . . . , RFx being the throws.

In the example of FIG. 10, each switch arm is shown to include an APCB on the common node (RFC) side. More particularly, an APCB 102a is shown be implemented across the two end transistor blocks on the common node (RFC) side of the switch arm 104a, an APCB 102b is shown be implemented across the two end transistor blocks on the common node (RFC) side of the switch arm 104b, etc., and an APCB 102x is shown be implemented across the two end transistor blocks on the common node (RFC) side of the switch arm 104x.

In the example of FIG. 10, the switch circuit 100 can be utilized so that a signal flows into the common node RFC and through a respective switch arm, and out through the corresponding separate node. The switch circuit 100 can also be utilized so that a signal flows into a respective separate node and through the corresponding switch arm, and out through the common node RFC.

In the examples of FIGS. 9 and 10, each switch circuit includes a plurality of switch arms that share a node. For example, in FIG. 9, switch arms 104a and 104b share a node RFin1. In another example, in FIG. 10, all of the switch arms RF1, RF2, . . . , RFx share a common node RFC. In such switch circuits, one of such switch arms can be in an ON state, and another switch arm can be in an OFF state.

It is also noted that for any switch arm (with or without another switch arm that shares a node as in the examples of FIGS. 9 and 10), a shunt arm can be provided from an end node of the switch arm. In such a configuration, when the switch arm is ON, the shunt arm can be OFF; and when the switch arm is OFF, the shunt arm can be ON.

It is noted that 3rd harmonics can be generated by series switch transistors (e.g., FETs) in ON states; and in ON states, voltage drop on series FETs is relatively low because of low on resistance (Ron) of the FETs. The 3rd harmonics typically arise from 3rd order component of an RF current flowing through the FETs. It is further noted that the OFF FETs handle RF voltage. Thus, an amplitude-phase cancelling function block (APCB) as described herein can allow cancellation or significant reduction of 3rd order harmonics in switch circuits.

Figure 11:
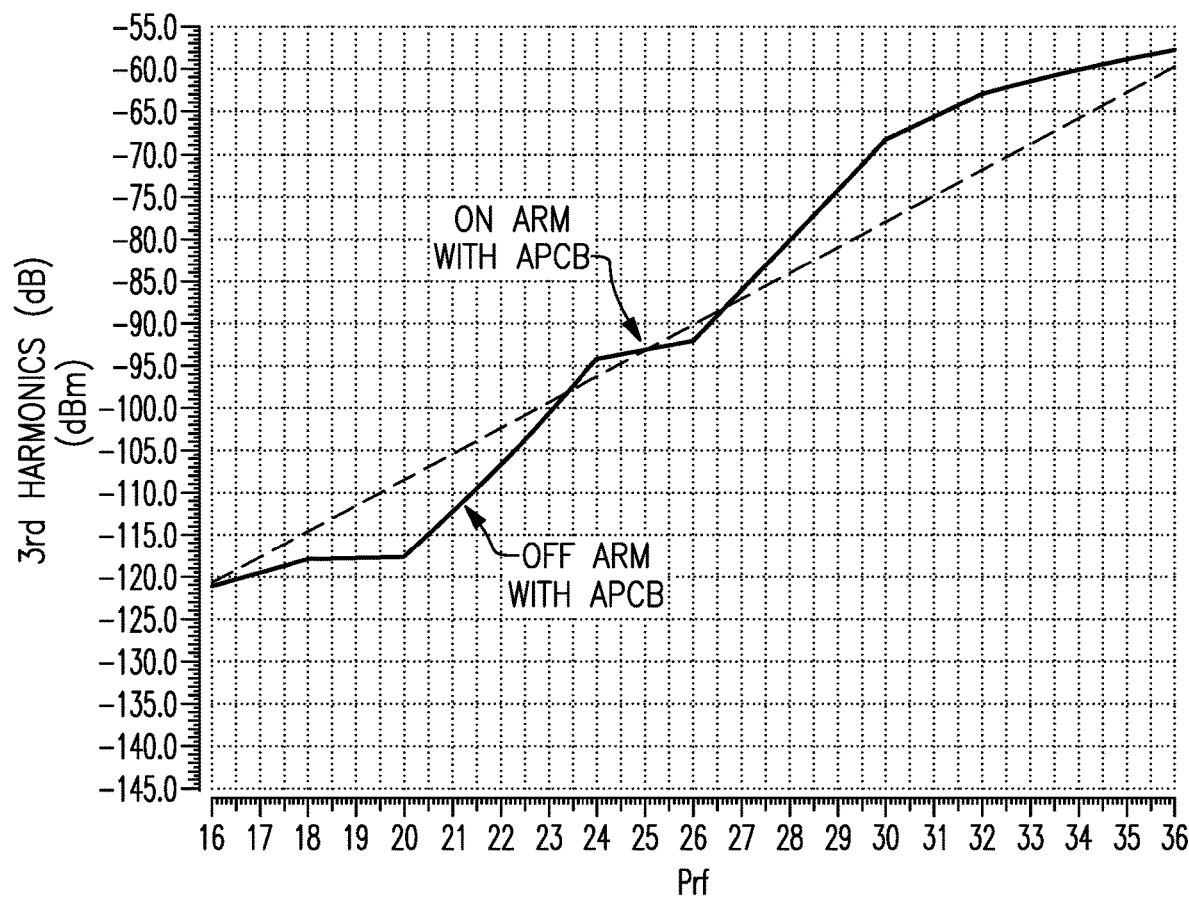
FIG. 11 shows a plot of a 3rd harmonic amplitude for an ON arm and a plot of a 3rd harmonic amplitude for an OFF arm.

For example, FIG. 11 shows a plot of a 3rd harmonic amplitude for an ON arm (dashed line), and a plot of a 3rd harmonic amplitude for an OFF arm (solid line). Each of the ON and OFF arms is assumed to include an APCB as described herein. As seen in FIG. 11, the ON arm (with APCB) and the OFF arm (with APCB) generate 3rd harmonic amplitudes that are similar. It is noted that at the example RF power value of approximately 25, the 3rd harmonic amplitudes of the ON and OFF arms are approximately the same.

Figure 12:
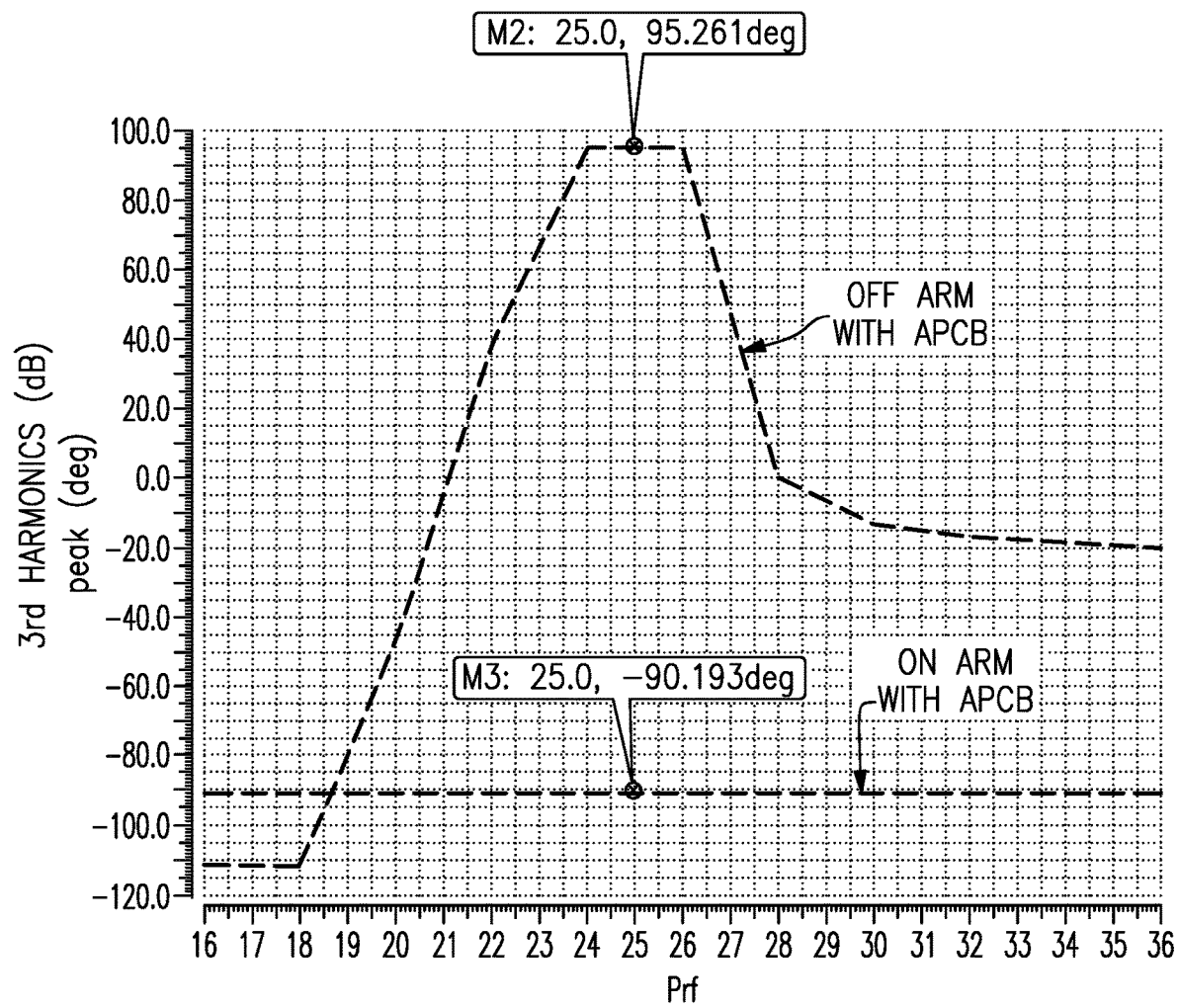
FIG. 12 shows that for the ON and OFF arms of FIG. 11, the phases of the 3rd harmonics are opposite, at least when the 3rd harmonic amplitudes of the ON and OFF arms are the same.

FIG. 12 shows that for the ON and OFF arms of FIG. 11, the phases of the 3rd harmonics are opposite, at least when the 3rd harmonic amplitudes of the ON and OFF arms are approximately the same. For example, at the RF power value of approximately 25 (where the 3rd harmonic amplitudes of the ON and OFF arms are approximately the same as shown in FIG. 11), the OFF arm has a 3rd harmonic phase of approximately +95 degrees, and the ON arm has a 3rd harmonic phase of approximately −90 degrees. Accordingly, the 3rd harmonic generated in one arm (e.g., the ON arm) can be substantially canceled by the 3rd harmonic generated in the other arm (e.g., the OFF arm).

Figure 13:
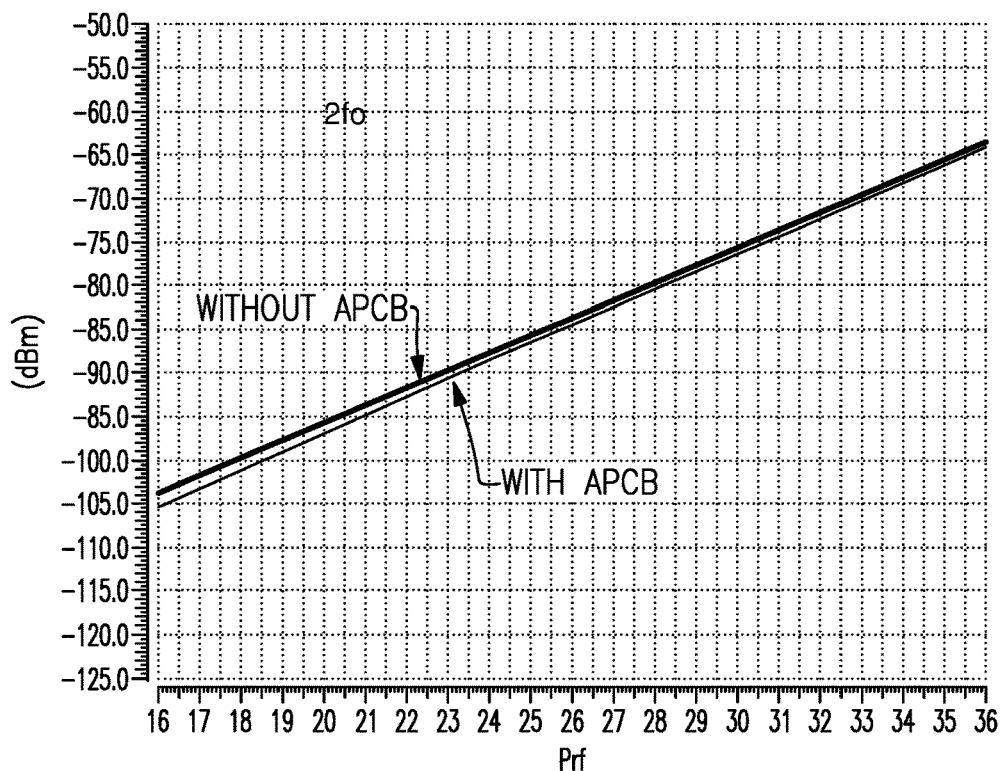
FIG. 13 shows plots of 2nd harmonic amplitude distributions for a switch circuit without APCB functionality and for a switch circuit having APCB functionality.

FIG. 13 shows plots of 2nd harmonic amplitude distributions for a switch circuit without APCB functionality and for a switch circuit having APCB functionality. One can see that performance with respect to 2nd harmonic is generally not impacted by the APCB functionality. As described herein, the anti-parallel combination of diodes in an APCB can result in the APCB not generating 2nd harmonics while improving performance with respect to 3rd harmonics.

Figure 14:
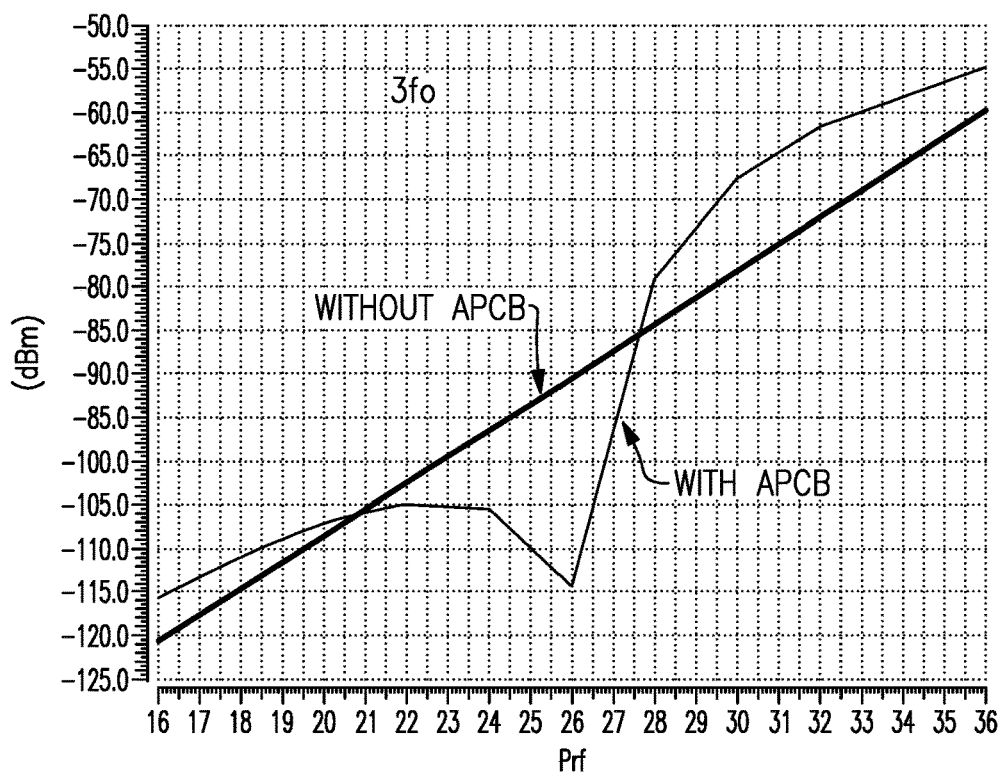
FIG. 14 shows an example of an improvement in performance with respect to 3rd harmonics.

FIG. 14 shows an example of an improvement in performance with respect to 3rd harmonics. In FIG. 14, a 3rd harmonic amplitude distribution is shown for a switch circuit without APCB functionality. Also shown is a 3rd harmonic amplitude distribution for a switch circuit with APCB functionality. As one can see, the 3rd harmonic is suppressed significantly at a selected RF power.

Figure 15:
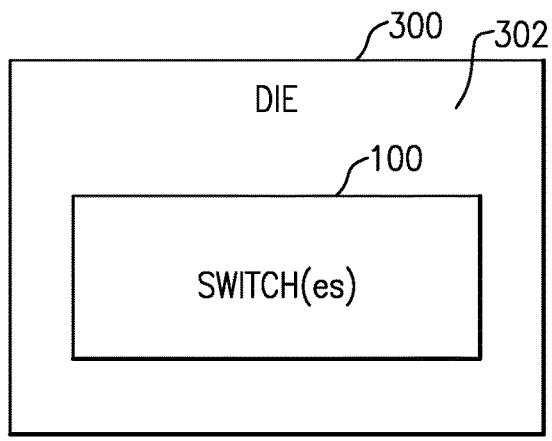
FIG. 15 shows that in some embodiments, a switch circuit having one or more features as described herein can be implemented on a die.

FIG. 15 shows that in some embodiments, a switch circuit 100 having one or more features as described herein can be implemented on a die 300. Such a die can include a substrate 302 such as, for example, silicon-on-insulator (SOI) substrate. In such a configuration, the switch circuit 100 can include one or more stacks of FETs implemented as SOI devices. In some embodiments, at least some of the switch circuit 100 of FIG. 15 can be configured to provide APCB functionality as described herein.

Figure 16:
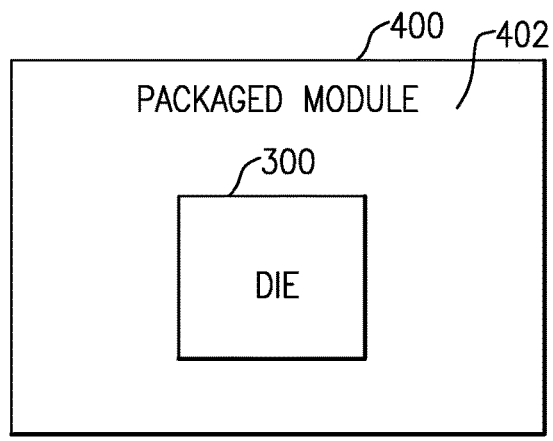
FIG. 16 shows that in some embodiments, a switch circuit having one or more features described herein can be implemented in a packaged module.

FIG. 16 shows that in some embodiments, a switch circuit having one or more features described herein can be implemented in a packaged module 400. Such a packaged module can include a packaging substrate 402 configured to receive a plurality of components. At least some of the components mounted on the packaging substrate 402 can include a die 300 such as the die 300 of FIG. 15.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 17:
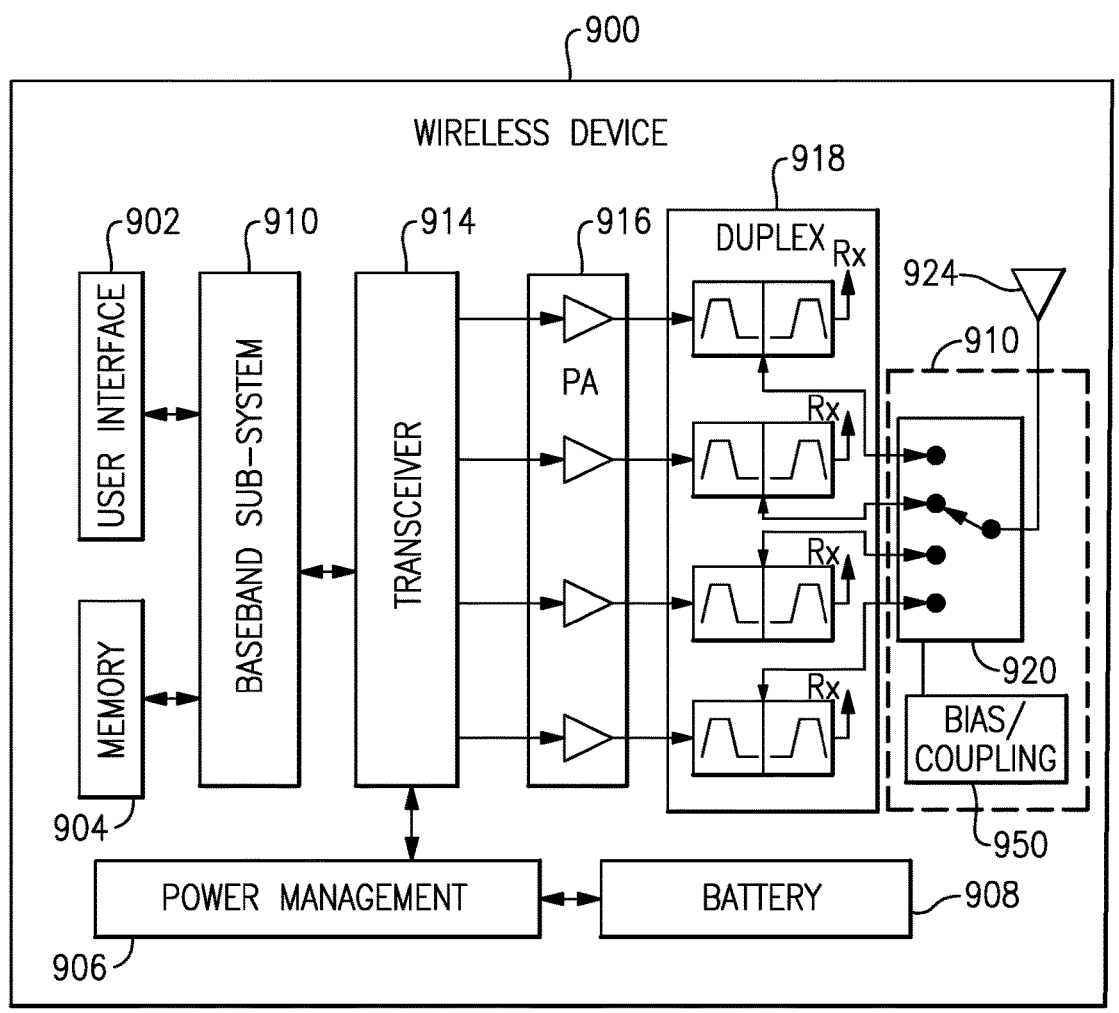
FIG. 17 depicts an example wireless device having one or more advantageous features described herein.

FIG. 17 depicts an example wireless device 900 having one or more advantageous features described herein. In the context of various switches as described herein, a switch 920 and a bias/coupling circuit 950 can be part of a module 910. In some embodiments, such a switch module can support, for example, multi-band multi-mode operations of the wireless device 900.

In the example wireless device 900, a power amplifier (PA) assembly 916 having a plurality of PAs can provide one or more amplified RF signals to the switch 920 (via an assembly of one or more duplexers 918), and the switch 920 can route the amplified RF signal(s) to one or more antennas. The PAs 916 can receive corresponding unamplified RF signal(s) from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 910.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexers 918 can allow transmit and receive operations to be performed simultaneously using a common antenna (e.g., 924). In FIG. 17, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switch circuit comprising:
   first and second switch arms, each switch arm configured as a respective signal path and including a plurality of transistors arranged in series to form a stack between a first arm node and a second arm node, the first arm node of the first switch arm coupled to the first arm node of the second switch arm; and
   an amplitude-phase cancelling block implemented to be parallel to a plurality of transistors of each switch arm, and configured such that a third harmonic resulting from an ON state of the first switch arm is substantially canceled by a third harmonic resulting from an OFF state of the second switch arm, the amplitude-phase cancelling block including a first block arranged in series with a second block, each block including first and second nodes such that the second node of the first block is coupled to the first node of the second block, each block including a series arrangement of the respective first node, a first resistance, a middle node, a second resistance and the respective second node, a first transistor having source and drain coupled to each other and to the middle node and a gate coupled to the first node, and a second transistor having source and drain coupled to each other and to the middle node and a gate coupled to the second node, body of the first transistor connected directly to body of the second transistor.

2. The radio-frequency switch circuit of claim 1 wherein the first and second blocks are configured to generate harmonics by a voltage distributed by a voltage divider formed by the resistances of the first and second blocks.

3. The radio-frequency switch circuit of claim 2 wherein a capacitance between the gate and the coupled source/drain of the first transistor and a capacitance between the gate and the coupled source/drain of the second transistor are selected to provide respective phase shifts of the harmonics.

4. The radio-frequency switch circuit of claim 3 wherein the first and second blocks of the amplitude-phase cancelling block are configured to generate substantially nil amount of a second harmonic.

5. The radio-frequency switch circuit of claim 1 wherein the amplitude-phase cancelling block is implemented with the respective switch arm in a symmetric manner.

6. The radio-frequency switch circuit of claim 5 wherein the number of transistors between the amplitude-phase cancelling block and the first arm node is the same as the number of transistors between the amplitude-phase cancelling block and the second arm node.

7. The radio-frequency switch circuit of claim 5 wherein each switch arm is configured to be operated with the first arm node as an input node, or with the second arm node as an input node.

8. The radio-frequency switch circuit of claim 1 wherein the amplitude-phase cancelling block is implemented with the respective switch arm in an asymmetric manner.

9. The radio-frequency switch circuit of claim 8 wherein each switch arm is configured to be operated with one of the first and second arm nodes as an input node, and the other arm node as an output node.

10. The radio-frequency switch circuit of claim 1 wherein at least the plurality of transistors are implemented as field-effect transistors.

11. The radio-frequency switch circuit of claim 10 wherein the field-effect transistors are implemented as silicon-on-insulator devices.

12. A semiconductor die comprising:
    a substrate; and
    a radio-frequency switch circuit implemented on the substrate, and including first and second switch arms, each switch arm configured as a respective signal path and including a plurality of transistors arranged in series to form a stack between a first arm node and a second arm node, the first arm node of the first switch arm coupled to the first arm node of the second switch arm, the radio-frequency switch circuit further including an amplitude-phase cancelling block implemented to be parallel to a plurality of transistors of each switch arm, and configured such that a third harmonic resulting from an ON state of the first switch arm is substantially canceled by a third harmonic resulting from an OFF state of the second switch arm, the amplitude-phase cancelling block including a first block arranged in series with a second block, each block including first and second nodes such that the second node of the first block is coupled to the first node of the second block, each block including a series arrangement of the respective first node, a first resistance, a middle node, a second resistance and the respective second node, a first transistor having source and drain coupled to each other and to the middle node and a gate coupled to the first node, and a second transistor having source and drain coupled to each other and to the middle node and a gate coupled to the second node, body of the first transistor connected directly to body of the second transistor.

13. The semiconductor die of claim 12 wherein the substrate includes a silicon-on-insulator substrate.

14. A radio-frequency module comprising:
    a packaging substrate configured to support a plurality of components; and
    a radio-frequency switch circuit implemented on the packaging substrate, and including first and second switch arms, each switch arm configured as a respective signal path and including a plurality of transistors arranged in series to form a stack between a first arm node and a second arm node, the first arm node of the first switch arm coupled to the first arm node of the second switch arm, the radio-frequency switch circuit further including an amplitude-phase cancelling block implemented to be parallel to a plurality of transistors of each switch arm, and configured such that a third harmonic resulting from an ON state of the first switch arm is substantially canceled by a third harmonic resulting from an OFF state of the second switch arm, the amplitude-phase cancelling block including a first block arranged in series with a second block, each block including first and second nodes such that the second node of the first block is coupled to the first node of the second block, each block including a series arrangement of the respective first node, a first resistance, a middle node, a second resistance and the respective second node, a first transistor having source and drain coupled to each other and to the middle node and a gate coupled to the first node, and a second transistor having source and drain coupled to each other and to the middle node and a gate coupled to the second node, body of the first transistor connected directly to body of the second transistor.

* * * * *